United States Patent
Van Loan et al.

[11] Patent Number: 6,025,729
[45] Date of Patent: Feb. 15, 2000

[54] FLOATING SPRING PROBE WIRELESS TEST FIXTURE

[75] Inventors: David Van Loan, Diamond Bar, Calif.; Gary F. St. Onge, Ballston Lake, N.Y.; Mark A. Swart, Anaheim Hills, Calif.

[73] Assignee: Delaware Capital Formation, Inc., Wilmington, Del.

[21] Appl. No.: 08/927,191

[22] Filed: Sep. 11, 1997

[51] Int. Cl.[7] .................................................. G01R 31/02
[52] U.S. Cl. ........................ 324/755; 324/754; 324/758; 324/761
[58] Field of Search ................... 324/761, 754, 324/755, 758, 158.1

[56] References Cited

U.S. PATENT DOCUMENTS

| | | | |
|---|---|---|---|
| 4,061,969 | 12/1977 | Dean | 324/73 |
| 4,352,061 | 9/1982 | Matrone | 324/158 |
| 4,866,375 | 9/1989 | Malloy | 324/158 |
| 5,422,575 | 6/1995 | Ferrer et al. | 324/754 |
| 5,485,096 | 1/1996 | Aksu | 324/761 |
| 5,493,230 | 2/1996 | Swart et al. | 324/761 X |
| 5,543,718 | 8/1996 | Normile et al. | 324/539 |
| 5,555,422 | 9/1996 | Nakano | 324/754 |
| 5,773,988 | 6/1998 | Sayre et al. | 324/761 |
| 5,818,248 | 10/1998 | St. Onge | 324/754 X |

*Primary Examiner*—Josie Ballato
*Assistant Examiner*—T. R. Sundaram
*Attorney, Agent, or Firm*—Christie, Parker & Hale, LLP

[57] ABSTRACT

A test fixture for a printed circuit board having a pattern of test probes and a fixed probe plate and a top plate adapted for movement toward and away from the probe plate. The probe plate and the top plate have selected patterns of holes for passage of the test probes through the probe plate and the top plate for contacting test points on the printed circuit board which is supported at one end of the test fixture. A probe retention sheet is positioned below the probe plate in an area of the test pins so that the test probes that extend through the probe plate also extends through the probe retention sheet, the probe retention sheet includes a preformed pattern of openings which are undersized with respect to an outside diameter of the test probes which extend through the pin retention sheet so that the retention sheet naturally applies a compression force around a circumference of the test probes extending through the sheet at a level sufficient to retain the test probes within the test fixture.

22 Claims, 3 Drawing Sheets

FLOATING SPRING PROBE WIRELESS TEST FIXTURE

FIELD OF THE INVENTION

This invention relates generally to in-circuit testing apparatus for printed circuit boards, and more particularly, to an in-circuit test fixture having a stationary probe plate and a moveable top plate having a plurality of spring loaded test probes which freely float in the fixture between the unit under test and the interface to the test electronics.

BACKGROUND OF THE INVENTION

Automatic test equipment for checking printed circuit boards has long involved use of a "bed of nails" test fixture to which the circuit board is mounting during testing. This test fixture includes a large number of spring-loaded test probes arranged to make electrical contact under spring pressure with designated test points on the board under test. Any particular circuit laid out on a printed circuit board is likely to be different from other circuits, and consequently, the bed of nails arrangement for contacting test points in a particular board must be customized for that circuit board. When the circuit to be tested is designed, a pattern of test points to be used in checking the board is selected, and a corresponding array of test probes is configured in the test fixture. This typically involves precision-drilling a pattern of holes in a probe plate to match the customized array of test probes, and then mounting the test probes in the drilled holes on the probe plate. The circuit board is then mounted on the fixture, superimposed over the array of test probes. During testing, the spring loaded test probes are brought into spring pressure contact with the test points on the board under test. Electrical test signals are transferred from the board to the test probes and then to the exterior of the fixture for communication with a high speed electronic test analyzer which detects continuity or lack of continuity between the various test points in the circuits on the board.

Various approaches have been used in the past for bringing the test probes in the circuit board into pressure contact for in-circuit testing. One class of these fixtures is a wired test fixture in which the test probes are individually wired to separate interface contacts for use in transmitting test signals from the probes to the external test analyzer. These wired test fixtures are often referred to as "vacuum test fixtures" since a vacuum is applied to the interior of the test fixture housing during testing to draw the circuit into contact with the test probes. Pneumatic or mechanical type test fixtures are also popular. In a vacuum fixture, a moveable top plate is mounted over the stationary probe plate and a vacuum seal is formed between the top plate and the probe plate. A second vacuum seal is mounted above the top plate and has a sufficient height to hold the printed circuit board above the spring probes which project through access holes drilled in the top plate for alignment with the underside of the board. During use, a vacuum applied to the region between the probe plate and the top plate is also applied the underside of the board. This compresses both vacuum seals and pulls the board down against and into electrical contact with the test probes. By maintaining the vacuum seal, the probes are held in spring-pressure contact with the test points on the board while the board is tested.

In order for the probes to make contact with the proper test points of the circuit board, the bottom stationary probe plate and the moveable top plate which supports the board must remain in a parallel relationship, to hold the board flat while maintaining its position perpendicular to the probe field. A reliable vacuum seal also is necessary.

A further class of test fixtures is also called "dedicated" test fixtures, also known as "grid-type fixtures" in which the random pattern of test points on the board are contacted by translator pins which transfer test signals to interface pins arranged in a grid pattern in a receiver. In the grid-type testers, fixturing is generally less complex and simpler than in the customized wired test fixtures; but with a grid system, the grid interfaces and the test electronics are substantially more complex and costly. The interface pins are generally single-ended spring probes which are retained within the receiver.

The spring probes of the vacuum fixtures and the grid-type fixtures have been retained within the fixtures by two previous methods. In a first method the receptacle of the spring probe includes a press ring and is rigidly mounted within a hole in the probe plate. The press rings retains the receptacle and consequently the spring probe within the fixture. Detents in the receptacle allow the probe plunger to be inserted and retained within the receptacle. Electrical connection to the probe assembly is most commonly made using a wire wrap around the square pin installed in the receptacle. Other common electrical connections are made using crimped wire, push on terminals, or by soldering a wire to the receptacle. Double-ended spring probes are also used in on-grid testing wherein the receptacle of the double-ended spring probe is firmly secured to the probe plate by a press ring. Electrical connection to the double-ended spring probe assembly is most commonly made by using a printed circuit board installed internally, to replace the wires. These are commonly referred to as wireless fixtures. The probe on one end contacts the unit under test, while the probe on the other end, makes electrical contact with the fixture printed circuit board.

A second method of retaining the test probes is by the use of a Mylar sheet wherein the spring probes extend through and below the receiver or probe plate through holes in the receiver or probe plate and are maintained by the Mylar sheet which is rigidly held below the receiver or probe plate. The spring probes include a wide groove, which is a reduced diameter roll on the probe barrel and the Mylar sheet fits in the groove which allows the probe to move up and down with respect to the receiver or probe plate equal to the height of the groove.

Both of these types of spring loaded test probe retention systems includes disadvantages and drawbacks due to current trends in the printed circuit board testing environment. One problem encountered is current probe/receptacle assemblies are prone to inaccuracies. The receptacle may be installed at an angle within the hole through the receiver or probe plate, or may tilt or pivot about the press ring within the hole. Further inaccuracy can be created due to the height at which the press ring is positioned within the receiver or probe plate. In addition, the probe is positioned within a barrel within the receptacle creates inaccuracies due to variations in materials and the need for clearance for the probe plunger to slide within the barrel and the barrel to slide within the receptacle. Another problem encountered is that by having two tubes mounted concentrically also reduces the available area for the spring which reduces possible higher spring force and spring life for the probes. Furthermore the use of spring probes having a receptacle with press rings is contrary to the increasing trend of miniaturization. The projecting press rings on the receptacle reduces the capability of close spacing of the spring probes which is undesirable if the required pin density must be increased to match a tight density spacing of test points.

Another problem is that a double-ended spring probes are prone to damage, due to the small size of the bottom probe and the assembly process. In most instances, the plate that holds the double-ended probes and the fixture printed circuit board are assembled using stand-offs. If the screw that pulls the printed circuit board into place through the stand-offs are not tightened evenly, the probes will be damaged or broken. This can be a serious problem in that wireless fixtures need to be disassembled to replace broken or damaged spring probes.

The current trend of miniaturization has resulted in a trend to use "no clean flux" for electrical connections. The use of this type of flux tends to have more contamination covering the test targets, which makes achieving reliable electrical contact more difficult. The industry solution is to use higher spring force and/or sharper probes. A suitable high spring force is unfortunately difficult to achieve with conventional small diameter spring probes.

Yet another problem encountered with conventional test fixtures due to the current methods of retaining spring probes is high cost. The additional manufacturing steps associated with roll forming a groove in the barrel for use with Mylar or manufacturing press rings is multiplied when you consider that thousands of test probes can be used within a particular test fixture. In addition double-ended probes are by nature more expensive. Consequently, a need exists for an improved method of retaining test probes within a test fixture which addresses the problems created by prior art methods.

SUMMARY OF THE INVENTION

Briefly, one embodiment of this invention provides an in-circuit test fixture for testing printed circuit boards. The fixture has a vacuum chamber between a stationary probe plate and a moveable top plate. Separate adjustable linear bearings located at each quadrant of the fixture provide parallel alignment between the moving top plate and probe plate. A continuous enclosed vacuum seal located between the probe plate and the top plate bypasses the bearings so the bearings are outside the vacuum area. Receptacleless spring loaded test probes extend through holes in the probe plate and the top plate for access to the circuit board supported on a second vacuum seal above the top plate. The probes make spring biased electrical contact with the board when the top plate is moved down toward the probes under a vacuum applied to the bottom of the top plate. The top plate is secured to the probe plate by separate quick release latches extending through the linear bearings. Releasing the latch connections to the bearings allows the top plate to move in a plane aligned with the plane of the top plate for use in precisely aligning the board under test with the probe field.

A separate beef plate and spacer plate is positioned below the probe plate also containing a plurality of holes for guiding the spring probes. A space is positioned between the lower surface of the probe plate and the upper surface of the beef plate in which is located a thin, flexible probe retention sheet preferably comprising an elastomeric material which essentially floats in the space between the probe plate and beef plate. The probe retention sheet has a preformed pattern of openings having a size with respect to the size of the test probes which extend through the sheet which causes the elastomeric properties of the sheet around the openings to naturally apply a compression force around the test probes. This compression force retains the probes in the fixture and is moveable independently of the fixture plates so that the compression force acting on the spring probes allows the probes to move with the probe retention sheet independently of the other spring probes and the probe plates of the fixture.

By eliminating the need for a receptacle for the spring probe provides for superior accuracy by eliminating the assembly problems encountered with the receptacle and the tilting allowed by the receptacle by prior art fixtures. The spring probes now sit in a drilled hole through the probe plate and its placement is as accurate as the drilled hole. Since a receptacle is no longer needed with the spring probe, the play associated between the probe barrel and the receptacle has been eliminated. The additional advantage of higher spring force is now available since the receptacle has been eliminated allowing the size of the probes to be increased which allows for a higher spring force to be achieved while also using a more robust probe. With the increase in force, spring life and therefore probe life is significantly improved. The current design also significantly reduces cost by eliminating the need for double-ended spring probes or the additional manufacturing processes associated with roll forming a groove in the barrel or press rings. Additionally, the test fixture of the current design will allow the fixture to incorporate a lower profile requiring less storage space.

The novel concepts of this invention are equally applicable to their incorporation into the use in an on-grid tester to retain the test probes within the tester block or receiver by utilizing a standard single-ended spring probe positioned in the grid pattern of holes in the receiver and optionally retained by a probe retention sheet located within the receiver. The probe retention sheet would be located within a space between the top and bottom plates of the receiver. The inventive concept can also be applied to wired test fixtures for test probe retention.

These and other aspects of the invention will be more fully understood by referring to the following detailed description and the accompanied drawings.

DETAILED DESCRIPTION

Figure 1:
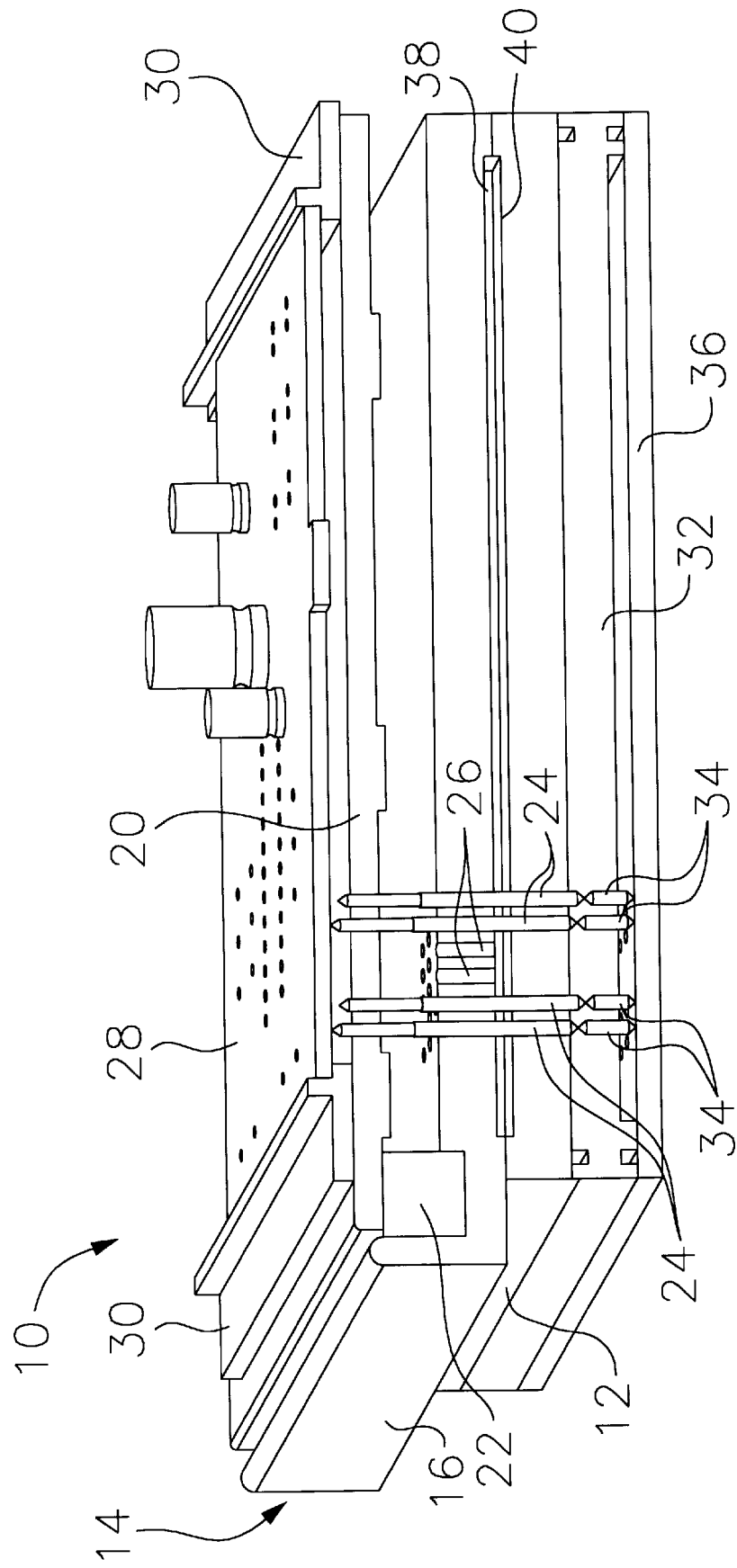
FIG. 1 is a schematic diagram illustrating in partial prospective an in-circuit vacuum test fixture according to the principles of the this invention.

FIG. 1 is a perspective view illustrating one embodiment of a test fixture 10 in accordance with the principles of the this invention. The fixture includes a rectangular vacuum housing having a beef plate 12 and a vacuum well subassembly 14 mounted above the beef plate. Although the present invention is described here as a vacuum type fixture, it is to be understood that other types of loaded board fixtures such as pneumatically or mechanically operated fixtures are contemplated by the invention. The vacuum well subassembly 14 includes a rectangular vacuum well formed by an upright rectangular wall 16 extending around the perimeter of the fixture 10. The bottom of the vacuum well is formed by a stationary, rectangular, rigid probe plate 18 within the confines of the outer wall 16. The sub-assembly also includes a flat, rectangular moveable top plate 20 resting on a gasket seal 22 inside the wall 16 of the vacuum well. The top plate extends above and parallel to the plane of the probe plate 18. A plurality of receptacleless spring loaded test probes 24 (only a few are shown for simplicity) are mounted through separate holes drilled through the beef plate, probe plate, and moving top plate. The holes 26 are precision-drilled through the fixture plates. The test probes 24 extend upwardly through the moving top plate to make contact with test pads on the unit under test 28. The holes in the probe plate are preferably larger in diameter than the diameter of the spring probes. The holes are preferably larger to prevent the spring probes from sticking when slight misalignment exists between the probe plate and the top plate.

Several features of a vacuum test fixture are well-known and conventional within the art and are not shown. These include a vacuum connection to the interior of the fixture for drawing a vacuum in the vacuum chamber space between the moveable top plate and the stationary probe plate. The fixture further includes linear bearing assemblies with quick release latches for movement of the top plate as known in the art and as shown and described in U.S. Pat. No. 5,422,575, the disclosure of which is incorporated herein by reference.

The unit under test 28 is positioned above the top plate 20 and rests on an additional vacuum seal gasket 30. (Certain situations may exist where the unit under test is placed directly on top of the test probes and a force applied to the unit under test to make electrical connection during testing.) The unit under test shown is a loaded circuit board. Vacuum seal 30 affixed to the top plate surrounds the probe field and supports the board above and spaced from the tips of the test probes 24. The probes are aligned for contact with the test points on the unit under test, and when a vacuum is drawn within the vacuum chamber the vacuum is also applied to the space below the board and above the top plate. This compresses the board down toward and into electrical contact with the test probes for use in conducting circuit continuity testing. As stated, the top plate 20 is supported for movement toward and away from the probe plate on a system of upright linear bearings (not shown) the bearings are preferably located in quadrants spaced around the perimeter of the test fixture. In a preferred arrangement, the bearings are located in the four corners of the probe plate 18. The linear bearings secure the top plate in a fixed position relative to the probe plate so that the circuit board supported on the top plate are precisely aligned with the probe field.

Positioned below the beef plate is a spacer plate 32 also having a plurality of holes containing spacer pins 34. Considering the unit under test is a loaded circuit board the test pads or test locations can have varying heights along the unit under test. Consequently if all of the spring probes 24 are the same length, different sized spacer pins 34 are incorporated to accommodate the varying heights of the test locations. Alternatively, varying length spring probes can be utilized without spacer pins 34 and would extend through the holes in the spaces plate.

The spacer pins, or alternatively when spacer pins are not utilized, the spring probes are in electrical contact with a printed circuit board 36 located below the spacer plate which is electrically coupled to an external electronic test analyzer (not shown) for conducting in-circuit testing on the board in a manner well-known in the art. The test analyzer contains electronic interrogation circuits to electronically interrogate separate test points on the unit under test in order to determine whether or not an electrical connection exists between any two given test locations. The electrical connections detected between test points on the tested board are electronically compared with stored reference results obtained from a previous interrogations of test points or a faultless master printed circuit board. The tested board is good is test results match the stored reference results, but if any problem exists in the circuits on the board, the problem is detected by the test results and bad boards then can be separated from the good boards.

The test probe retention system of the present invention comprises a probe retention sheet 38 positioned within a space 40 between the upper surface of the beef plate 12 and the lower surface of the probe plate 18. Openings are formed through the probe retention sheet 38 by either drilling holes or cutting slits through the sheet for the spring probes 24. The probe retention sheet preferably comprises a thin, flat, flexible sheet of a closed-cell rubber material which can comprises either synthetic rubber or natural rubber. The preferred rubber is a latex rubber which can comprise both natural and synthetic latex. Although rubber is the preferred material for the probe retention sheet, other materials for the sheet can be utilized so long as the material can retain the spring probes within the probe plate. Examples of such material could be open cell urethane commonly sold under the trade name Poron, cellular neoprene or silicone foam. An elastomeric sheet is useful for its capability of applying a resiliently compressible force to the test probes.

The fixture is assembled by overlaying the latex sheet on the top surface of the beef plate within the opening 40, allowing the latex sheet to rest on the top surface of the beef plate without being adhered to the beef plate. The flexible elastomeric sheet is particularly free from adherence to the beef plate in areas where the test probes pass through the sheet. The sheet is therefore freely movable or "floats" within the opening with the test probes toward or away from the beef plate. Tooling pins (not shown) could be used to register the pin retention sheet and would be located on the beef plate passing through one or more of the corners of the sheet.

The openings through the probe retention sheet are made to match the pattern of holes drilled through the beef plate and the probe plates. The spring probes are then inserted through the openings in the probe retention sheet. The openings drilled in the sheet are undersized with respect to the outside diameter of the spring probes, whereas the holes in the beef plate are slightly oversized with respect to the outside diameter of the spring probes. The openings in the probe retention sheet are drilled by a standard drill bit which does not form a circular hole in the sheet, but instead forms a generally S-shaped slotted opening (referred to as an irregularly shaped slotted opening). As the drill bit spins, it slices the sheet and the sheet moves away, leaving the generally S-shaped opening with flexible resilient flaps on opposite sides. The flaps resiliently cling to the sides of the test, probes to produce the resiliently compressible retention forces that holds the probes in place. The openings are considered undersized with respect to the outside diameter of the probes because the cross-sectional open area of the generally S-shaped slotted opening is less than the cross-sectional area of the test probe. Preferably, the probe retention sheet comprises a flexible sheet of natural latex closed-cell elastomeric rubber having a thickness from about 0.020 to about 0.040 inch, more preferably having a thickness of about 0.03 inch.

Advantages of using the probe retention sheet of this invention are that the elastomeric latex rubber material has high tear resistance and good memory (recovery force), and is a reasonably inexpensive material. During use, the elastic material also produces a good level or retention force laterally on the sides of the test probes sufficiently to hold the probes in place in the fixture, independently of any other structural components of the fixture. The retention sheet is also free to move up or down with movement of the test probes such as when adjacent probes contact adjacent pads of different height on the board under test.

Figure 2:
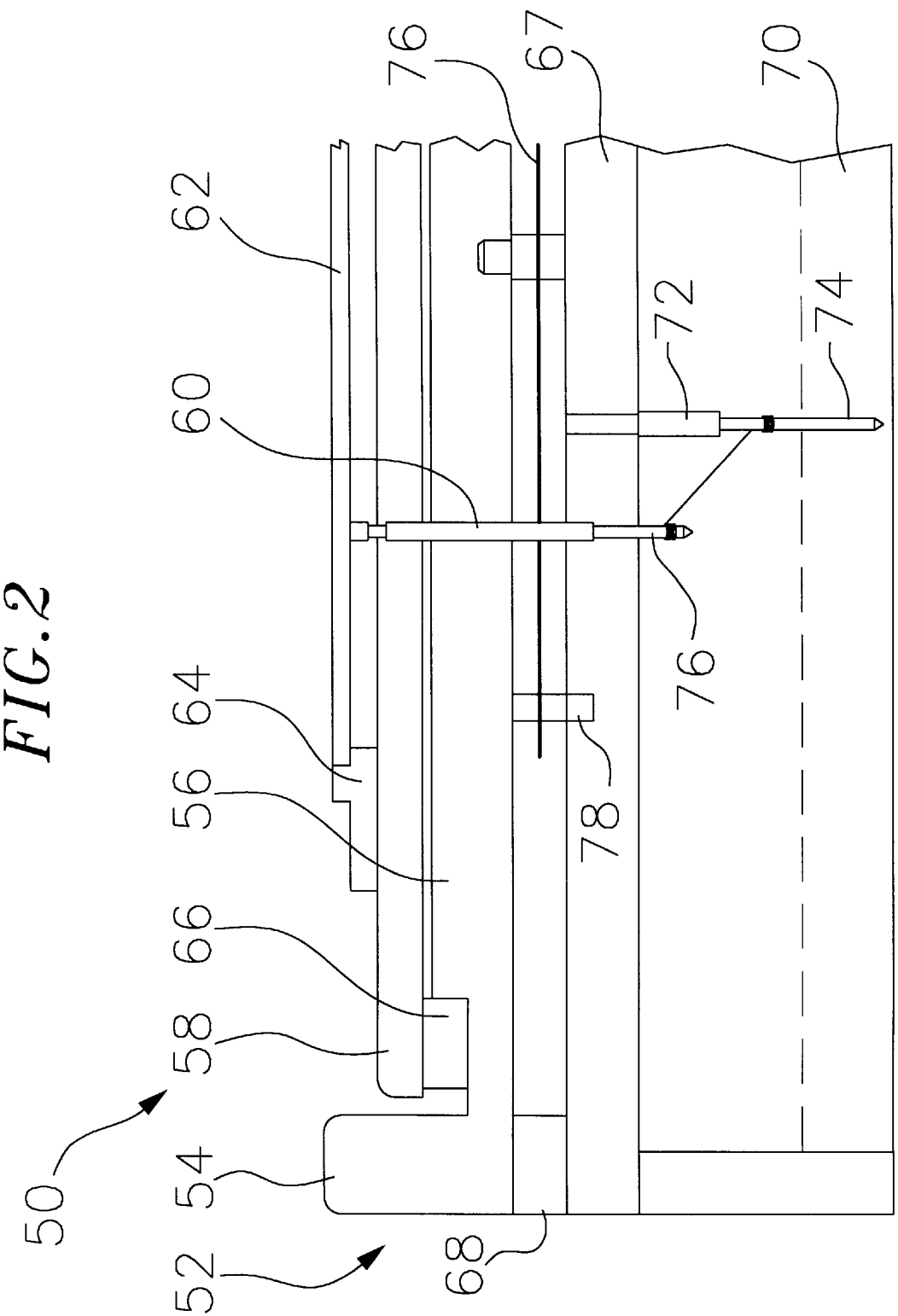
FIG. 2 is a schematic view of a first alternative embodiment wired vacuum test fixture.

Although the invention as shown in FIG. 1 is for use in connection with a wireless test fixture, the inventive concepts are equally applicable to a wired test fixture 50 as shown in FIG. 2. Wired fixture 50 includes a rectangular vacuum housing 52 having a rectangular vacuum well formed by an upright rectangular wall 54 extending around the perimeter of the fixture. The bottom of the vacuum well is formed by a stationary, rectangular ridge probe plate 56 within the confines of the outer wall. The fixture also includes a moveable top plate 58 which extends above and parallel to the plane of the probe plate. A plurality of spring loaded test probes 60, of which one is shown for simplicity, are positioned in the fixture and extend through holes in the probe plate and the moveable top plate. The test probes, are conventional spring loaded test probes well known in the art. The test probes extend upwardly through the top plate for electrical contact with test pads on the unit under test 62. The unit under test rests on a vacuum seal 64 positioned on the upper surface of the top plate and an additional vacuum seal 66 is positioned between the lower surface of the top plate and the upper surface of the probe plate 56.

Positioned below the probe plate is a beef plate 67 spaced away from the probe plate by a gasket 68. Positioned below the beef plate is a personality pin frame 70 containing a plurality of personality pins 72 having pin tails 74 which are wired to the pin tail 76 of the test probe 60. Pin tail 74 is in electrical contact with a plurality of spring probes positioned in the test electronics (not shown) which is conventional in the art.

Test probes 60 are retained within the probe plate by a probe retention sheet 76, preferably a latex sheet as discussed above with respect to the test fixture of FIG. 1. Unlike FIG. 1, probe retention sheet 76 is positioned in the X and Y coordinates by a dowel pin 78 extending upwardly from the beef plate wherein a separate dowel pin is positioned in the beef plate corresponding to each corner of the probe retention sheet. Alternatively the test probes of the fixtures of FIG. 1 or FIG. 2 could be captured between the unit under test and the interface to the test electronics without the use of a probe retention sheet.

Figure 3:
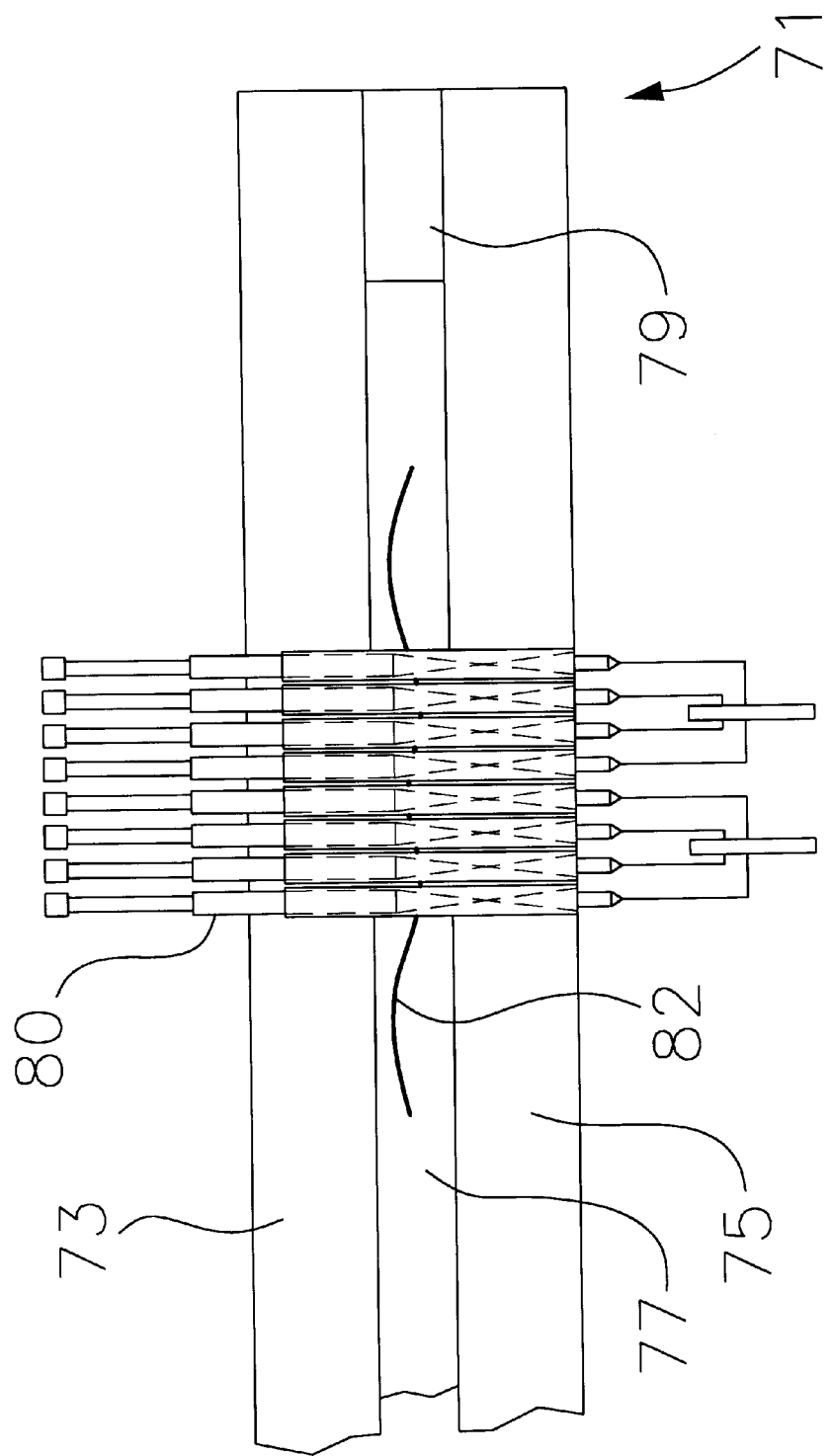
FIG. 3 is a partial front view of a second alternative embodiment depicting the inventive concept for use with a receiver of a universal grid tester.

FIG. 3 illustrates how the probe retention system of the present invention can be applied to retention of receptacle-less spring probes in a universal grid cartridge (receiver) in a grid tester for translation of test signals from a test fixture to the test electronics. In FIG. 3 the universal grid cartridge 71 comprises a top plate 72 and a bottom plate 74. A space 76 is formed between the top plate and the bottom plate by a spacer plate 78 positioned on the edges of the top and bottom plate. A plurality of spring probes 80 are positioned within holes extending through the top and bottom plates and are retained within the universal grid cartridge by a probe retention sheet 82 located in the space 77 between the top and bottom plate. Again probe retention sheet 82 is preferably a latex sheet as discussed with respect to the embodiments of FIGS. 1 and 2.

Although the invention has been described and illustrated with respect to three embodiments thereof, it is to be understood that the invention is not to be so limited since other changes and modifications can be made which are within the full intended scope of this invention as hereinafter claimed.

We claim:

1. A test fixture adapted for alignment of test probes with circuits on a printed circuit board under test comprising:
    a fixture base having a fixed probe plate;
    an array of test probes extending through the probe plate and individually moveable in an axial direction through the probe plate;
    a top plate positioned generally parallel to the probe plate and adapted for movement toward and away from the probe plate and the array of test probes, the top plate supporting the board under test in a position generally parallel to the top plate so that the test probes can contact circuits on the board under test when the top plate and probe plate are moved toward each other; and
    a probe retention sheet positioned below the probe plate to rest loosely adjacent to and unattached to a lower surface of the probe plate in an area of the test probes so that the test probes that extend through the probe plate also extend through the probe retention sheet.

2. The test fixture of claim 1 wherein the probe retention sheet includes a preformed pattern of openings which are undersized with respect an outside diameter of the test probes which extend through the probe retention sheet so that the sheet naturally applies a resilient compression force around a circumference of the test probes extending through the sheet at a level sufficient to retain the test probes within the fixture, the probe retention sheet being freely moveable independently of the probe plate.

3. The test fixture of claim 1 wherein the probe retention sheet comprises a thin flexible sheet of natural or synthetic latex rubber.

4. The test fixture of claim 1 where in the probe retention sheet includes a plurality of slotted openings with resiliently flexible flaps that apply individual compression forces to the test probes.

5. The test fixture of claim 1 further comprising a frame containing a plurality of personality pins which are individually wired to separate test probes.

6. The test fixture of claim 1 further comprising a beef plate positioned below and adjacent the probe plate.

7. The test fixture of claim 6 further comprising a spacer plate positioned below the beef plate containing one or more spacer pins.

8. A test probe retention system for a loaded printed circuit board test fixture having a pattern of test probes extending through a fixed probe plate and a top plate adapted for movement toward and away from the probe plate, the probe plate and the top plate having selected patterns of holes for passage of the test probes for contacting test points on the printed circuit board which is supported at one end of the test fixture, the test probe retention system including a probe retention sheet positioned below the probe plate in an area of the test probes so that the test probes that extend through the probe plate also extend through the probe retention sheet, the probe retention sheet applies a force around a circumference of the test probes extending through the sheet at a level sufficient to retain the test probes within the test fixture.

9. The test probe retention system of claim 8 wherein the test fixture further includes a beef plate positioned below and adjacent the probe plate; and
    wherein the probe retention sheet is located in a space between the probe plate and the beef plate.

10. The test probe retention system of claim 9 further comprising a spacer plate containing at least one spacer pin positioned below the beef plate.

11. The test probe retention system of claim 8 wherein the probe retention sheet includes a preformed pattern of openings which are undersized with respect to an outside diameter of the test probes which extend through the probe retention sheet so that the sheet naturally applies a resilient compression force around a circumference of the test probes extending through the sheet at a level sufficient to retain the test probes within the fixture, the probe retention sheet being freely movable independently of the probe plate.

12. The test probe retention system of claim 8 wherein the probe retention sheet comprises a thin, flexible sheet of natural or synthetic latex rubber.

13. The test probe retention system of claim 8 wherein the probe retention sheet includes a plurality of slotted openings with resiliently flexible flaps that apply individual compression forces to the test probes.

14. A grid tester comprising:

a test fixture;

a receiver upon which the test fixture is positioned, the receiver comprising:

a first probe plate;

a second probe plate located parallel to and spaced from the first probe plate by a spacer plate;

said first and second plates having a plurality of universally spaced holes drilled therethrough for receipt of a spring probe; and a flexible probe retention sheet positioned between the first probe plate and the second probe plate to rest loosely between the first probe plate and the second probe plate in an area of the spring probes so that the spring probes that extend through the first probe plate and the second probe plate also extend through the probe retention sheet.

15. The receiver of claim 14 wherein the probe retention sheet includes a preformed pattern of openings which are undersized with respect an outside diameter of the spring probes which extend through the probe retention sheet so that the sheet naturally applies a resilient compression force around a circumference of the spring probes extending through the sheet at a level sufficient to retain the spring probes within the receiver, the probe retention sheet being freely moveable independently of the first and second probe plates.

16. The receiver of claim 14 wherein the probe retention sheet comprises a thin flexible sheet of natural or synthetic latex rubber.

17. The receiver of claim 14 where in the probe retention sheet includes a plurality of slotted openings with resiliently flexible flaps that apply individual compression forces to the spring probes.

18. A test fixture adapted for alignment of test probes with test sites on a printed circuit board under test to translate test signals from the test sites to external test electronics comprising:

a stationary probe plate having a plurality of holes extending therethrough;

an array of test probes extending through the holes in the probe plate and individually movable in an axial direction through the probe plate;

a top plate positioned generally parallel to the probe plate and adapted for movement toward and away from the probe plate, the top plate further includes a plurality of holes to guide the test probes extending therethrouqh towards the test sites; and an interface located below the probe plate and in contact with the test probes to translate the test signals to the external test electronics when the board under test and the probe plate are moved toward each other.

19. The test fixture of claim 18 further comprising a probe retention sheet positioned below the probe plate so that the test probes that extend through the probe plate also extend through the probe retention sheet.

20. The test fixture of claim 18 wherein the interface is a printed circuit board.

21. The test fixture of claim 18 wherein the interface is a plurality of wired pins.

22. The test fixture of claim 18 wherein the holes in the probe plate have a diameter greater than a diameter of the test probes.

* * * * *

UNITED STATES PATENT AND TRADEMARK OFFICE
CERTIFICATE OF CORRECTION

PATENT NO. : 6,025,729
DATED : February 15, 2000
INVENTOR(S) : David Van Loan; Gary F. St. Onge; Mark A. Swart It is certified that error appears in the above-identified patent and that said Letters Patent is hereby corrected as shown below:

Column 1,
Line 15, replace "is mounting" with -- is mounted --.
Line 56, after "applied" insert -- to --.

Column 2,
Line 15, replace "press rings retains" with -- press rings retain --.
Line 28, after "internally" delete the comma.
Line 31, after "end" delete the comma.
Line 58, after "receptacle" insert -- which --.
Line 66, before "double-ended" delete "a".

Column 3,
Line 4, after "stand-offs" change "are" to -- is --.

Column 4,
Line 1, replace "receptacle for the" with -- receptacle, the --.
Line 34, change "accompanied" to -- accompanying --.
Line 40, before "invention" delete "this".
Line 50, before "invention" delete "this".

Column 5,
Line 51, change "spaces" to -- spacer --.
Line 64, before "previous" delete "a".
Line 66, replace "is test results" with -- if test results --.

Column 6,
Line 11, change "comprises" to -- comprise --.
Line 47, after "test" delete the comma.
Line 63, after 'fixture" delete the comma.

Column 7,
Line 8, replace "ridge" with -- rigid --.
Line 14, after "test probes" delete the comma.
Lines 45-46, replace "space 76" with -- space 77 --.

UNITED STATES PATENT AND TRADEMARK OFFICE
CERTIFICATE OF CORRECTION

PATENT NO. : 6,025,729
DATED : February 15, 2000
INVENTOR(S) : David Van Loan; Gary F. St. Onge; Mark A. Swart It is certified that error appears in the above-identified patent and that said Letters Patent is hereby corrected as shown below:

Column 8,
Line 14, after "with respect" insert -- to --.
Line 24, replace "where in" with -- wherein --.

Column 9,
Line 28, after "with respect" insert -- to --.

Column 10,
Line 1, replace "where in" with -- wherein --.

Signed and Sealed this

Eighteenth Day of December, 2001

Attest:

JAMES E. ROGAN
*Attesting Officer*  *Director of the United States Patent and Trademark Office*